United States Patent
Sun et al.

(10) Patent No.: US 12,510,612 B2
(45) Date of Patent: Dec. 30, 2025

(54) CURRENT SENSOR FOR PRINTED CIRCUIT BOARD

(71) Applicant: GlobalFoundries Singapore Pte. Ltd., Singapore (SG)

(72) Inventors: Yongshun Sun, Singapore (SG); Eng Huat Toh, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 27 days.

(21) Appl. No.: 18/523,657

(22) Filed: Nov. 29, 2023

(65) Prior Publication Data
US 2025/0172641 A1    May 29, 2025

(51) Int. Cl.
*G01R 33/09* (2006.01)
*H05K 1/18* (2006.01)

(52) U.S. Cl.
CPC .......... *G01R 33/098* (2013.01); *H05K 1/181* (2013.01); *H05K 2201/0137* (2013.01); *H05K 2201/10287* (2013.01)

(58) Field of Classification Search
None
See application file for complete search history.

(56) References Cited

U.S. PATENT DOCUMENTS

| | | | | |
|---|---|---|---|---|
| 5,009,725 A | * | 4/1991 | Ellison | B23K 35/38 148/23 |
| 5,677,247 A | * | 10/1997 | Hundt | H05K 7/1069 438/117 |
| 10,649,010 B2 | * | 5/2020 | Raberg | G01R 17/10 |
| 11,719,773 B2 | * | 8/2023 | Dixit | G01R 33/093 324/260 |
| 11,791,083 B2 | * | 10/2023 | Toh | G01R 33/098 324/252 |
| 2006/0012459 A1 | * | 1/2006 | Lenssen | G01R 33/09 338/32 R |
| 2011/0147867 A1 | * | 6/2011 | Slaughter | G01R 33/093 257/E21.705 |
| 2012/0306487 A1 | * | 12/2012 | Yao | G01R 15/205 324/252 |
| 2013/0008022 A1 | * | 1/2013 | Yao | G01R 33/09 29/830 |
| 2013/0341803 A1 | * | 12/2013 | Cheah | H01L 24/17 257/774 |
| 2015/0177285 A1 | * | 6/2015 | Higashi | G01R 19/0092 324/144 |
| 2016/0163962 A1 | * | 6/2016 | Mather | H10N 50/01 257/421 |

(Continued)

OTHER PUBLICATIONS

"How motherboards are made: a miracle of modern electronics," PC Plus, published Aug. 15, 2010, 13 pp. (Year: 2010).*

(Continued)

*Primary Examiner* — William J Klimowicz (57) ABSTRACT

A contactless current sensing circuit for sensing current in a conductive wire on a dielectric substrate of a printed circuit board (PCB) includes a plurality of magnetic tunneling junction (MTJ) structures including first and second MTJ structures on a first side of the conductive wire, and third and fourth MTJ structures on a second side of the conductive wire opposite to the first side. The MTJ structures are located within the H-field induced by a current flowing through the conductive wire.

7 Claims, 5 Drawing Sheets

(56) References Cited

U.S. PATENT DOCUMENTS

| | | | | |
|---|---|---|---|---|
| 2021/0096195 A1* | 4/2021 | Muehlenhoff | ......... | H10N 50/01 |
| 2021/0333337 A1* | 10/2021 | Hainz | ................... | G01R 33/09 |
| 2022/0384082 A1* | 12/2022 | Toh | ........................ | H01F 41/32 |
| 2023/0123660 A1* | 4/2023 | Qu | ..................... | G01R 19/0092 |
| | | | | 324/126 |
| 2024/0295586 A1* | 9/2024 | Yi | ....................... | G01R 15/205 |

OTHER PUBLICATIONS

Enrique García Vidal et al., Electronic Energy Meter Based on a Tunnel Magnetoresistive Effect (TMR) Current Sensor, Materials, Sep. 26, 2017, pp. 1-11, www.mdpi.com/journal/materials.
European Search Report and Written Opinion from related application No. EP24178126.9 dated Nov. 11, 2024.

* cited by examiner

CURRENT SENSOR FOR PRINTED CIRCUIT BOARD

BACKGROUND

Sensing current flowing through wiring of printed circuit boards (PCBs) is typically implemented within circuits by directly measuring the current flowing through a wire using a component in the current path such as a shunt resistor. However, adding components to the current path has some effect on the current, and typically some amount of power loss is associated with direct current measurements, especially at high current levels. Contactless current measurements can be made by current transformers. However, current transformers cannot measure DC currents, and current transformers are typically relatively large devices that are not suitable for miniaturization.

Another type of non-contact measurement is a Hall-effect sensor, which operates under the principle that for a copper trace on a PCB with current flowing through it, a proportional magnetic field is created around the current-carrying conductor. By measuring such a magnetic field, information on the value of the current that produced it can be obtained. The sensing element often has the PCB copper flow through the sensing-element package, and some others place the sensor above the copper trace and sense through proximity only.

Anisotropic magneto-resistance (AMR) sensors measure changes in an angle of a magnetic field by using iron material. The resistance of the iron material in the AMR sensors depends on a direction of current flow and direction of magnetization. The AMR sensors determine non-contact position measurements in harsh environments. Giant magneto-resistance (GMR) sensors use quantum mechanics effects with a non-magnet material between two iron material layers. The GMR sensors result in high resistance for anti-parallel spin alignment and low resistance for parallel spin alignment, when a current passes through one of the two iron material layers.

SUMMARY

Embodiments of the present application relate to a current sensing circuit implemented on a printed circuit board (PCB), and more particularly to a contactless current sensing circuit using magnetic tunneling junction (MTJ) structures.

In an embodiment, a current sensing circuit includes a conductive wire on a dielectric substrate of a printed circuit board (PCB), a plurality of magnetic tunneling junction (MTJ) structures including first and second MTJ structures on a first side of the conductive wire, and third and fourth MTJ structures on a second side of the conductive wire opposite to the first side.

In an embodiment, an apparatus includes a printed circuit board (PCB) including a dielectric substrate, a conductive wire on the dielectric substrate, a plurality of magnetic tunneling junction (MTJ) structures including first and second MTJ structures on a first side of the conductive wire, and third and fourth MTJ structures on a second side of the conductive wire opposite to the first side.

In an embodiment, a method for forming a current sensing circuit includes placing, on a PCB with a conductive wire, a plurality of magnetic tunneling junction (MTJ) structures including first and second MTJ structures on a first side of the conductive wire, and third and fourth MTJ structures on a second side of the conductive wire opposite to the first side.

DETAILED DESCRIPTION

Embodiments of the present application relate to a current sensing circuit, an apparatus comprising a current sensing circuit and a method for forming the current sensing circuit.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For clarity, technical material that is known in the technical fields related to this disclosure has not been described in detail so that the disclosure is not unnecessarily obscured. The figures are not drawn to scale, and some features are intentionally enlarged or diminished for emphasis and visual clarity.

Figure 1:
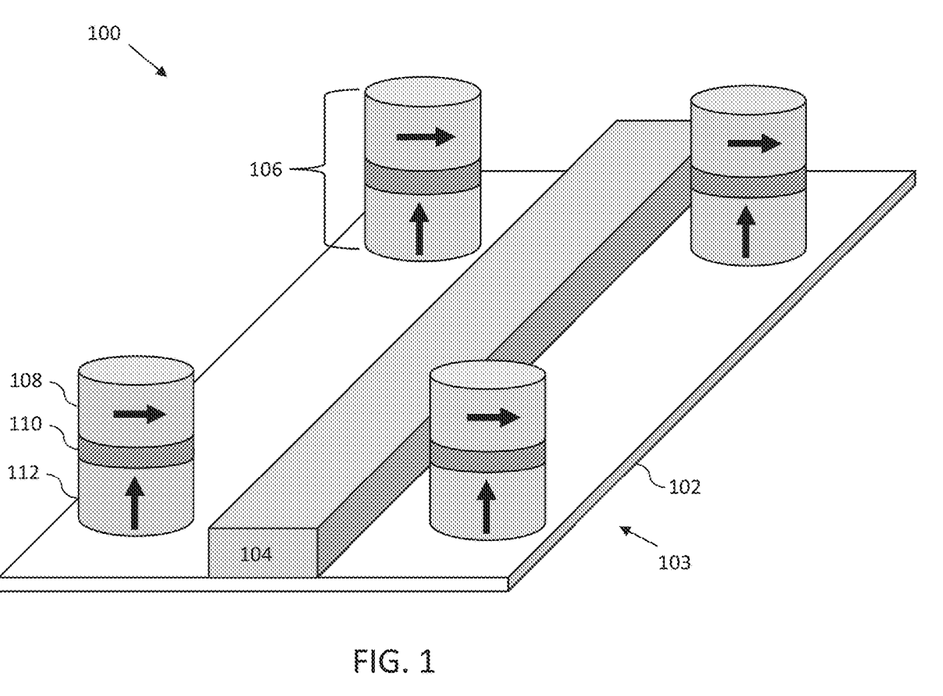
FIG. 1 illustrates a current sensing circuit according to an embodiment.

FIG. 1 illustrates an isometric view of an embodiment of a current sensing circuit 100. The current sensing circuit 100 includes a dielectric substrate 102 of a printed circuit board (PCB) 103 and a conductive wire 104 on the dielectric substrate 102. Four magnetic tunneling junction (MTJ) structures 106 are located on the PCB 103, with two of the MTJ structures 106 on one side of the wire 104 and two MTJ structures 106 on the opposite side of the wire 104.

The PCB 103 may include one or more layers or dielectric substrate 102, each of which may include a polymeric material such as epoxy, polyester, polyimide, or polytetrafluoroethylene. The polymeric material may be reinforced or interwoven with fibers such as glass or organic fibers. In some embodiments, PCB 103 is a laminate material of multiple layers, one or more of which is a layer of conductive material such as copper. In an embodiment, the PCB 103 includes a copper ground plane. Laminate layers may be alternating layers of polymer and fibers. In some embodiments, one or more layer of PCB 103 is a ceramic material. Examples of PCBs 103 are FR-4, CEM-2 and RF-35.

The wire 104 may be a conductive metal that is printed or otherwise suitably provided on the PCB 103. The dimensions of the wire 104 may be dictated by the intended application of the current sensor. For example, a thickness of a copper wire 104 may be from about 0.035 mm to 0.31 mm, and a width of a copper wire may be from about 0.25 mm to 7.6 mm. The specific size of wires 104 may vary between embodiments based on the application of the PCB 103 and the amount of current which the wire 104 is designed to handle.

An MTJ structure 106 comprises at least three layers of material including two layers of magnetic material 108 and 112 separated by a thin insulting layer 110. The magnetic material layers may include a pinned layer 112 which has a fixed magnetic orientation and a free layer 108. The magnetization direction of the free layer 108 may be adaptable, such that the magnetization direction changes when exposed to an external electromagnetic field. The MTJ structure 106 may be a perpendicular MTJ (pMTJ) structure.

For tunneling between the magnetic layers 108 and 112 of MTJ structure 106, the tunneling current is highest when the magnetization direction of the magnetic layers are parallel and tunneling current is lowest when the magnetization direction of the magnetic layers are anti-parallel. Accordingly, the resistance of an MTJ structure 106 is proportional to the difference in the magnetization direction between the pinned layer 112 and the free layer 108. This resistance may be referred to as the tunneling magnetic resistance (TMR) of an MTJ structure 106. When a voltage is applied to the magnetic materials, electrons can travel across the insulating layer 110 using quantum mechanical tunneling. In FIG. 1, the magnetization direction is indicated by the black arrows on magnetic layers 108 and 112.

Figure 2A:
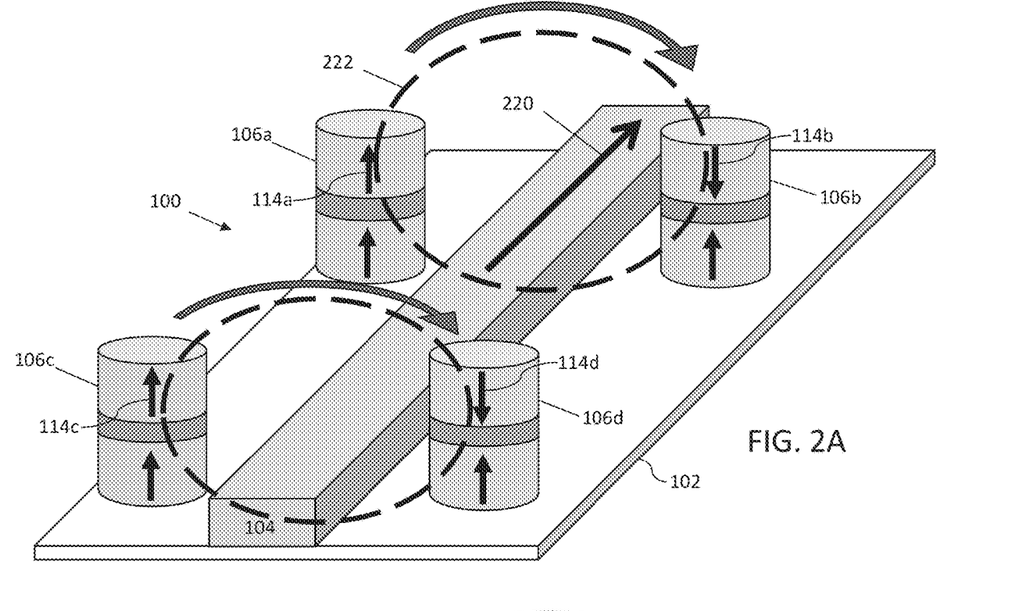
FIGS. 2A and 2B illustrate operations of a current sensing circuit in response to different amounts of current in a wire according to an embodiment.
Figure 2B:
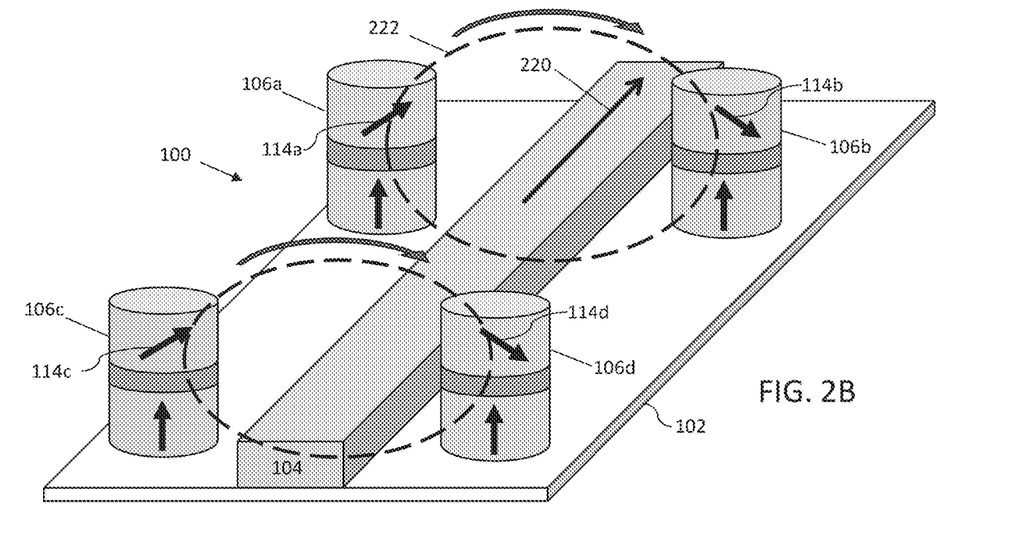

FIGS. 2A and 2B illustrate embodiments of the operation of a current sensing circuit 100. As seen in FIG. 2A, when a current 220 is flowing through wire 104, the current induces a magnetic field 222 or H-field around the wire. The direction of the magnetic field 222 is shown by the semicircular arrows in the figure, and conforms to the right-hand—rule, also known as Ampere's right-hand grip rule. According to the right-hand grip rule, the direction of the magnetic field is the same as the direction of the fingers in a right hand in a "thumbs-up" position when current is flowing in the direction of the thumb.

The flow of magnetic field 222 acts on the direction of magnetization 114 of the free layers 108 of the MTJ structures 106 by causing the direction of magnetization 114 to move in the direction of the magnetic field 222. As seen in FIG. 2A, when the current 220 is flowing through the wire 104, the magnetic field 222 induced by the current 220 causes the directions of magnetization 114a and 114c of MTJ structures 106a and 106c on one side of the wire 104 to orient upwards, and causes the directions of magnetization 114b and 114d of MTJ structures 106b and 106d on the opposite side of the wire 104 to orient downwards.

The orientations of the directions of magnetization 114 in FIG. 2A represent maxima, e.g. the directions 114 are oriented straight upwards and downwards which would cause the highest and lowest levels of resistance in the MTJ structures 106, and are provided here for purpose of illustration. In embodiments, elements of the current sensing circuit 100 such as the spacing between the MTJ structures 106 and the wire 104 and the construction of the MTJ structures 106 are configured so that the orientations of magnetization 114 are below the maxima under ordinary amounts of current 220.

FIG. 2B illustrates an embodiment of a current sensing circuit 100 at less than the maxima, e.g. a normal operating condition of the circuit 100. The magnetization directions 114 of MTJ structures 106 in FIG. 2A are changed from the default orientations shown in FIG. 1 due to the magnetic field 222 induced by current 220 flowing through wire 104. Accordingly, the MTJ structures 106 are positioned on dielectric substrate 102 so that the respective free layers 108 are within the magnetic field 222 of wire 104 when a normal amount of current 220 is flowing through the wire 104. For example, the distance between each MTJ structure 106 and the wire 104 may be on the millimeter scale, e.g. from less than a millimeter to a few millimeters.

The altered magnetization directions 114 result in the MTJ structures 106a and 106c on one side of the wire 104 having different resistances from the MTJ structures 106b and 106d on the opposite side of the wire 104. This difference can be exploited to measure the amount of current 220 flowing through the wire 104.

Figure 3:
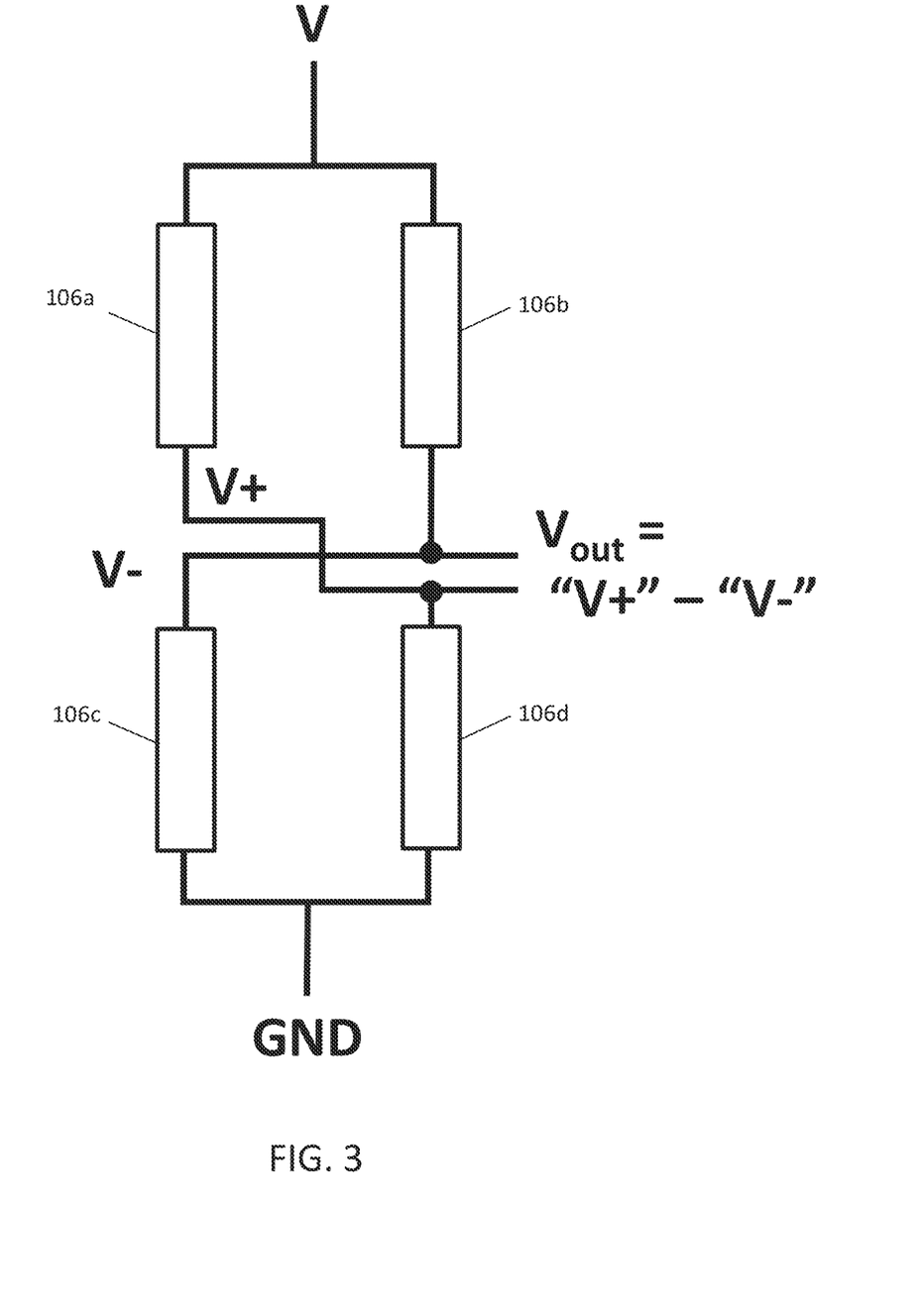
FIG. 3 is a schematic wiring diagram of a Wheatstone bridge circuit according to an embodiment.

As seen in FIG. 3, the MTJ structures 106a, 106b, 106c and 106d may be electrically coupled to one another in a Wheatstone bridge circuit. A Wheatstone bridge is well suited to measuring the current 220 in the wire 104 based on the different resistances of the MTJ structures 106 which are resistors in the circuit. When a voltage V is applied to the Wheatstone bridge circuit, the voltage difference across the output terminals ($V_{out}$) increases in proportion to the difference in resistance between the MTJ structures 106 on one side of the wire 104 (e.g. 106a and 106c) and the MTJ structures 106 on the opposite side of the wire 104 (e.g. 106b and 106d). Accordingly, the amount of current 220 flowing through the wire 104 is proportional to the potential difference between the output terminals, although the proportionality may be nonlinear. When the current 220 increases, $V_{out}$ of the Wheatstone bridges also increases, so the current 220 can be measured by measuring $V_{out}$.

Figure 4A:
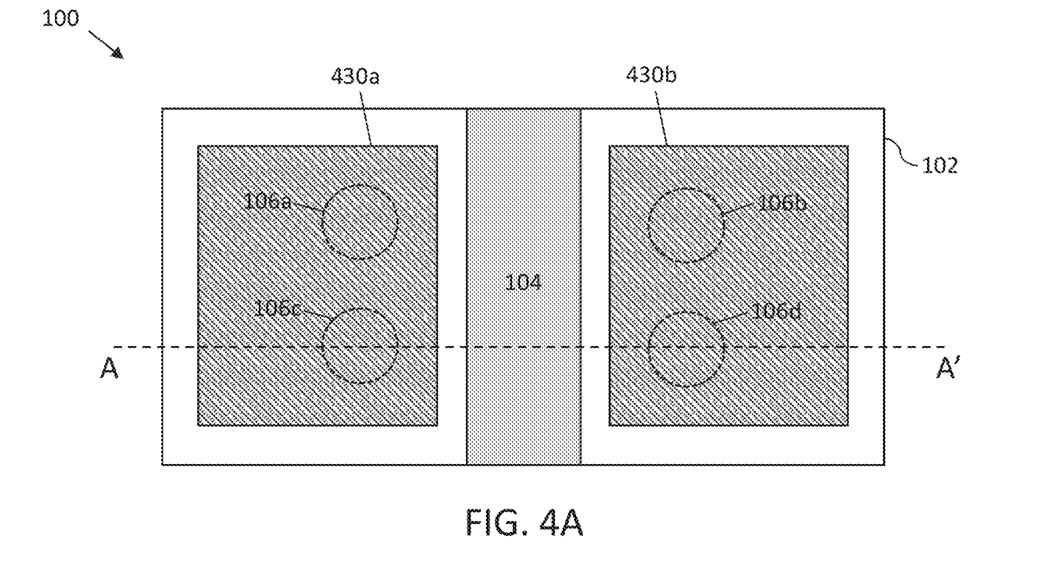
FIGS. 4A and 4B illustrate an embodiment of a current sensing circuit with two chips.
Figure 4B:
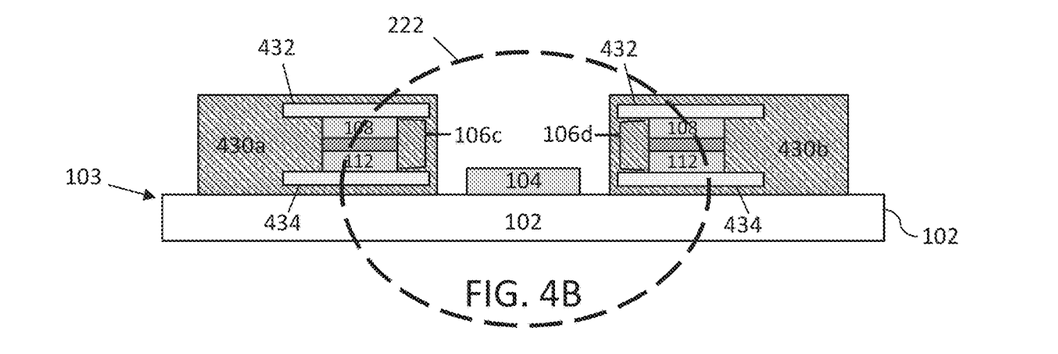

FIG. 4A illustrates a layout of a current sensing circuit 100, and FIG. 4B is a cross-sectional view of the circuit taken along A-A' of FIG. 4A. In the embodiment of FIGS. 4A and 4B, a first chip 430a including two MTJ structures 106a and 106c is located on one side of a wire 104, and a second chip 430b including two MTJ structures 106b and 106d is located on the opposite side of the wire 104. The first and second chips 430a and 430b are on the same side of dielectric substrate 102 as the wire 104 and positioned so that the free layers 108 of the MTJ structures are within an H-field 222 induced when current is flowing through wire 104.

As seen in FIG. 4B, each of the MTJ structures 106 includes an upper metal contact layer 432 coupled to free layer 108 and a lower metal contact 434 coupled to pinned layer 112. The metal contacts 432 and 434 are electrodes that couple the MTJ structures 106 in a Wheatstone bridge circuit as seen in FIG. 3. The chips 430 may include additional wiring and components as known in the art. For example, the chips 430 may include wiring to couple the MTJ structures 106 to ground and to voltage lines of the PCB 103, as well as additional devices as appropriate.

The chips 430 may be formed by known and existing or future developed processes. For example, components of a chip 430 may be formed by deposition, lithography, and etching methods.

In an embodiment, lower metal contacts 434 are formed by depositing and etching a conductive material on a semiconductor substrate. Each of the layers of material in the MTJ structures 106 may be deposited over the lower metal contacts 434 by a conventional deposition method such as a physical vapor deposition (PVD) or a chemical vapor deposition (CVD) process. Following the deposition processes, a resist formed over a topmost material is exposed to energy (light) to form a pattern (opening). An etching process with a selective chemistry, e.g., reactive ion etching (RIE), may be used to pattern the materials through the openings of the resist to form the respective MTJ structures 106. The resist can be removed by a conventional oxygen ashing process or other known stripants.

The free layer 108 and pinned layer 112 of the MTJ structures 106 may comprise alloys and/or multilayers of cobalt, iron, alloys of cobalt-iron, nickel, alloys of nickel iron, and alloys of cobalt-iron-boron. The thin insulating layer 110 may include an oxide material such as an oxide of magnesium or aluminum, for example. The magnetization direction of fixed layer 112 may be fixed by an adjacent synthetic anti-ferromagnetic (SAF) layer including one or more layer of material comprising one or more of Mn, Pt, Ir, Cr or Fe, for example. In addition, the MTJ structures 106 may include one or more layer such as a buffering layer comprising one or more layer a non-magnetic material such as Ru or Ta. The MTJ structures 106 may be comprised of various layers of these and other materials as known in the art to achieve desired performance characteristics and conform to desired deposition and etching processes.

Upper metal contacts 432 (and other wiring) may be formed over the MTJ structures 106 by similar deposition and etching processes. After the device and wiring structures are formed, they may be packaged in a polymeric packaging material such as an epoxy molding compound (EMC) exposing external connections such as pins or lead frames for attaching the chips 430 to circuitry of the PCB 103.

Figure 5A:
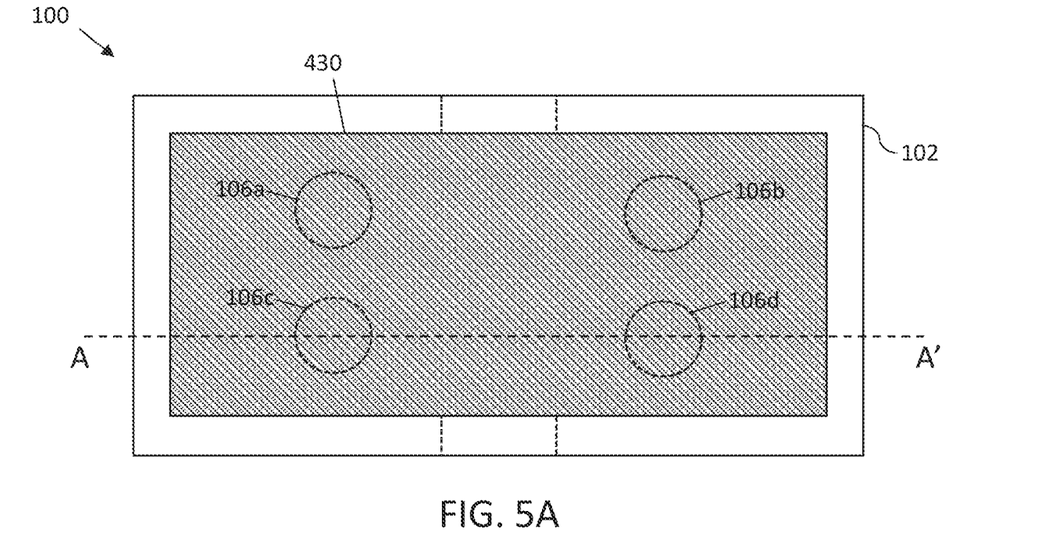
FIGS. 5A and 5B illustrate an embodiment of a current sensing circuit with one chip.
Figure 5B:
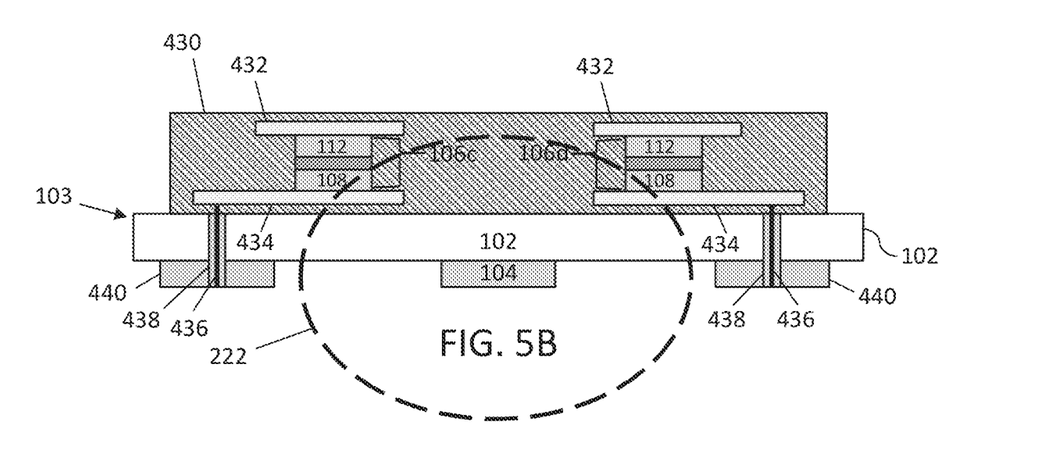

FIGS. 5A and 5B show a layout of a current sensing circuit 100 according to another embodiment. In the embodiment of FIGS. 5A and 5B, the MTJ structures 106 are packaged in a single chip 430, and the chip 430 is located on the opposite side of dielectric substrate 102 from the wire 104 for which the current is sensed. The chip 430 is configured so that the free layers 108 of the MTJ structures 106 are within an H-field 222 induced when current is flowing through wire 104. An advantage of the single-chip structure is that the chip 430 can include additional wiring between the MTJ structures on both sides of the wire 104, potentially reducing the number of traces on the PCB 103 used to form the Wheatstone bridge circuit.

In the example of FIG. 5B, the MTJ structures 106 are electrically coupled to wires 440 on the same side of the dielectric substrate 102 as wire 104 by pins 436 soldered to plated through holes 438 that extend through the substrate 102. The wires 440 may be used for input voltage V or an output line. Each chip 430 may be coupled to multiple wires 440 of PCB 103 for input output voltages, and for wiring between MTJ structures 106 that are disposed in separate chips 430. In addition, one or more chip 430 may be coupled to a ground layer of the PCB 103 by a plated through-hole 438. Although FIG. 5B shows the wires 104 and 440 on dielectric substrate 102 as being exposed, in some embodiments, one or more of the wires 104 and 440 is sandwiched between two dielectric substrates 102 in a multi-layer PCB 103.

A person of skill in the art will recognize that the circuit 100 can be implemented in various configurations without departing from the scope of this disclosure. For example, in some embodiments, each of the MTJ structures 106 is packaged in a separate chip 430. In another embodiment, each resistor in the Wheatstone bridge circuit may be implemented by connecting two or more MTJ structures 106 in series. In another embodiment, the MTJ structures 106 are included in a single chip 430 which is placed over the wire 104 on the same side of the dielectric substrate 102 as the wire 104 whose current is being sensed. Accordingly, embodiments may be implemented using different numbers of chips 430, and the one or more chip 430 may be located on the same side of dielectric substrate 102 as the wire 104 or on the opposite side of the dielectric substrate 102.

The circuit 100 may be incorporated into an electronic device. The device can be any product that measures current in a wire of a PCB in the device, ranging from toys and other low-end applications to advanced computer products having a display, a keyboard or other input device, and a central processor. The device may be a household appliance, a portable or stationary computing device, a vehicle or a component of a vehicle, an image capturing device, etc.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. A circuit comprising:
    a conductive wire on a dielectric substrate of a printed circuit board (PCB);
    a plurality of magnetic tunneling junction (MTJ) structures including first and second MTJ structures on a first side of the conductive wire; and
    third and fourth MTJ structures on a second side of the conductive wire opposite to the first side,
    wherein the first and second MTJ structures are packaged in a first chip, and the third and fourth MTJ structures are packaged in a second chip, the first chip located on the first side of the conductive wire and the second chip located on the second side of the conductive wire, and
    wherein the first, second, third and fourth MTJ structures are resistors in a Wheatstone bridge circuit.

2. The circuit of claim 1, wherein the first and second chip packages are located on the same side of the dielectric substrate as the conductive wire.

3. The circuit of claim 1, wherein the conductive wire is a copper trace printed on the PCB.

4. The circuit of claim 1, wherein the dielectric substrate is a polymer material, a fiber-reinforced polymer material, a fiber and polymer laminate, or a ceramic material.

5. The circuit of claim 1, wherein free layers of the plurality of MTJ structures are located within an H-field induced when a current flows through the wire and configured to change a magnetization direction in the presence of the H-field.

6. An apparatus comprising:
    a printed circuit board (PCB) including a dielectric substrate;
    a conductive wire on the dielectric substrate;
    a plurality of magnetic tunneling junction (MTJ) structures including first and second MTJ structures on a first side of the conductive wire; and
    third and fourth MTJ structures on a second side of the conductive wire opposite to the first side,
    wherein the first and second MTJ structures are packaged in a first chip, and the third and fourth MTJ structures are packaged in a second chip, the first chip located on the first side of the conductive wire and the second chip located on the second side of the conductive wire, and
    wherein the first, second, third and fourth MTJ structures are resistors in a Wheatstone bridge circuit.

7. A method for forming a current sensing circuit, the method comprising:

placing, on a printed circuit board (PCB) with a conductive wire, a plurality of magnetic tunneling junction (MTJ) structures including a first chip comprising first and second MTJ structures on a first side of the conductive wire, and a second chip comprising third and fourth MTJ structures on a second side of the conductive wire opposite to the first side, wherein the first and second MTJ structures are packaged in the first chip, and the third and fourth MTJ structures are packaged in the second chip, and wherein the first, second, third and fourth MTJ structures are resistors in a Wheatstone bridge circuit.

\* \* \* \* \*